(12) United States Patent
Park et al.

(10) Patent No.: US 7,745,323 B2
(45) Date of Patent: Jun. 29, 2010

(54) METAL INTERCONNECTION OF A SEMICONDUCTOR DEVICE AND METHOD OF FABRICATING THE SAME

(75) Inventors: Dong-Su Park, Icheon-shi (KR); Su Ho Kim, Icheon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 89 days.

(21) Appl. No.: 11/267,994

(22) Filed: Nov. 7, 2005

(65) Prior Publication Data
US 2007/0004192 A1    Jan. 4, 2007

(30) Foreign Application Priority Data
Jun. 29, 2005    (KR) .................. 10-2005-0057372

(51) Int. Cl.
    *H01L 21/4763*    (2006.01)
(52) U.S. Cl. .............. 438/618; 438/619; 438/620; 438/621; 438/623; 438/622; 257/783; 257/295; 257/700; 257/774; 257/773; 257/37; 257/292; 257/310
(58) Field of Classification Search ........ 438/618–623
    See application file for complete search history.

(56) References Cited

U.S. PATENT DOCUMENTS

| | | | | |
|---|---|---|---|---|
| 5,089,442 A | * | 2/1992 | Olmer ...................... | 438/631 |
| 5,332,694 A | * | 7/1994 | Suzuki ..................... | 438/624 |
| 5,416,048 A | * | 5/1995 | Blalock et al. ............. | 438/695 |
| 5,482,900 A | * | 1/1996 | Yang ....................... | 438/623 |
| 5,503,882 A | * | 4/1996 | Dawson .................... | 438/763 |
| 5,560,802 A | * | 10/1996 | Chisholm .................. | 438/692 |
| 5,563,104 A | * | 10/1996 | Jang et al. ................. | 438/761 |
| 5,607,773 A | * | 3/1997 | Ahlburn et al. ............ | 428/427 |
| 5,612,574 A | * | 3/1997 | Summerfelt et al. ........ | 257/783 |
| 5,619,393 A | * | 4/1997 | Summerfelt et al. ....... | 361/321.1 |
| 5,627,403 A | * | 5/1997 | Bacchetta et al. .......... | 257/639 |
| 5,679,606 A | * | 10/1997 | Wang et al. ................ | 438/763 |
| 5,716,890 A | * | 2/1998 | Yao ......................... | 438/624 |
| 5,798,298 A | * | 8/1998 | Yang et al. ................ | 438/622 |
| 5,808,363 A | * | 9/1998 | Watanabe .................. | 257/758 |
| 5,814,564 A | * | 9/1998 | Yao et al. .................. | 438/734 |
| 5,821,162 A | * | 10/1998 | Yamaha et al. ............. | 438/623 |
| 5,861,332 A | * | 1/1999 | Yu et al. ................... | 438/240 |
| 5,861,345 A | * | 1/1999 | Chou et al. ................ | 438/763 |
| 5,905,298 A | * | 5/1999 | Watatani ................... | 257/635 |
| 5,913,140 A | * | 6/1999 | Roche et al. ............... | 438/624 |

(Continued)

FOREIGN PATENT DOCUMENTS

KR    1999-57281    7/1999

(Continued)

*Primary Examiner*—Fernando L Toledo
*Assistant Examiner*—Ankush K Singal
(74) *Attorney, Agent, or Firm*—Marshall, Gerstein & Borun LLP

(57) ABSTRACT

Disclosed herein is a metal interconnection structure of a semiconductor device, comprising lower metal interconnection layers disposed on a semiconductor substrate, a buffer layer made of a metal oxide disposed thereon, an intermetallic dielectric layer made of a low-k material disposed on the buffer layer of the metal oxide, and an upper metal interconnection layer disposed on the intermetallic dielectric layer and electrically connected through the intermetallic dielectric layer and buffer layer to the lower metal interconnection layers.

5 Claims, 2 Drawing Sheets

U.S. PATENT DOCUMENTS

| | | | | |
|---|---|---|---|---|
| 5,915,200 A * | 6/1999 | Tokumasu et al. | | 438/623 |
| 5,932,487 A * | 8/1999 | Lou et al. | | 438/692 |
| 5,940,734 A * | 8/1999 | Inoue | | 438/781 |
| 5,946,592 A * | 8/1999 | Lin | | 438/633 |
| 5,960,321 A * | 9/1999 | Hsieh et al. | | 438/699 |
| 5,969,409 A * | 10/1999 | Lin | | 257/637 |
| 5,999,379 A * | 12/1999 | Hsiao et al. | | 360/320 |
| 6,004,873 A * | 12/1999 | Jang et al. | | 438/618 |
| 6,020,265 A * | 2/2000 | Lou | | 438/692 |
| 6,060,382 A * | 5/2000 | Lee | | 438/622 |
| 6,083,850 A * | 7/2000 | Shields | | 438/763 |
| 6,093,634 A * | 7/2000 | Chen et al. | | 438/622 |
| 6,093,637 A * | 7/2000 | Kishimoto et al. | | 438/624 |
| 6,103,586 A * | 8/2000 | Chetlur et al. | | 438/396 |
| 6,136,685 A * | 10/2000 | Narwankar et al. | | 438/624 |
| 6,144,060 A * | 11/2000 | Park et al. | | 257/310 |
| 6,159,842 A * | 12/2000 | Chang et al. | | 438/622 |
| 6,171,945 B1 | 1/2001 | Mandal et al. | | 438/622 |
| 6,187,683 B1 * | 2/2001 | De Santi et al. | | 438/697 |
| 6,191,050 B1 * | 2/2001 | Andideh | | 438/759 |
| 6,232,225 B1 * | 5/2001 | Pong et al. | | 438/640 |
| 6,239,034 B1 * | 5/2001 | Yang et al. | | 438/697 |
| 6,261,883 B1 * | 7/2001 | Koubuchi et al. | | 438/197 |
| 6,261,942 B1 * | 7/2001 | Zhou et al. | | 438/619 |
| 6,284,588 B1 * | 9/2001 | Yu | | 438/240 |
| 6,291,848 B1 * | 9/2001 | Chetlur et al. | | 257/306 |
| 6,319,848 B1 * | 11/2001 | Litwin et al. | | 438/761 |
| 6,320,213 B1 * | 11/2001 | Kirlin et al. | | 257/295 |
| 6,329,717 B1 * | 12/2001 | Jang et al. | | 257/750 |
| 6,337,282 B2 * | 1/2002 | Kim et al. | | 438/699 |
| 6,365,015 B1 * | 4/2002 | Shan et al. | | 204/192.3 |
| 6,372,664 B1 * | 4/2002 | Jang et al. | | 438/778 |
| 6,376,394 B1 * | 4/2002 | Tsai et al. | | 438/783 |
| 6,407,780 B1 * | 6/2002 | Sung | | 349/43 |
| 6,426,285 B1 * | 7/2002 | Chen et al. | | 438/624 |
| 6,451,666 B2 * | 9/2002 | Hong et al. | | 438/397 |
| 6,511,923 B1 * | 1/2003 | Wang et al. | | 438/783 |
| 6,562,668 B2 * | 5/2003 | Jang et al. | | 438/158 |
| 6,573,194 B2 * | 6/2003 | Brankner et al. | | 438/775 |
| 6,627,462 B1 * | 9/2003 | Yang et al. | | 438/3 |
| 6,709,971 B2 * | 3/2004 | Kozhukh et al. | | 438/622 |
| 6,727,184 B1 * | 4/2004 | Wang et al. | | 438/712 |
| 6,734,488 B1 * | 5/2004 | Aihara et al. | | 257/306 |
| 6,740,531 B2 * | 5/2004 | Cho et al. | | 438/3 |
| 6,770,556 B2 * | 8/2004 | Yau et al. | | 438/623 |
| 6,781,216 B2 * | 8/2004 | Nakamura | | 257/637 |
| 6,841,396 B2 * | 1/2005 | Celii et al. | | 438/3 |
| 6,911,397 B2 | 6/2005 | Jun et al. | | |
| 6,940,171 B2 * | 9/2005 | Hill | | 257/750 |
| 6,943,091 B2 * | 9/2005 | Yu et al. | | 438/424 |
| 6,972,451 B2 * | 12/2005 | Delpech et al. | | 257/304 |
| 6,974,985 B2 * | 12/2005 | Kurasawa et al. | | 257/296 |
| 6,982,444 B2 * | 1/2006 | Kanaya et al. | | 257/295 |
| 7,002,256 B1 * | 2/2006 | Nakamura | | 257/781 |
| 7,023,037 B2 * | 4/2006 | Cho et al. | | 257/295 |
| 7,042,034 B2 * | 5/2006 | Hong | | 257/295 |
| 7,141,503 B2 * | 11/2006 | Naughton et al. | | 438/692 |
| 7,262,136 B2 * | 8/2007 | Polinsky et al. | | 438/694 |
| 7,288,443 B2 * | 10/2007 | Zhu, Huilong | | 438/149 |
| 7,517,750 B2 * | 4/2009 | Choi et al. | | 438/211 |
| 2001/0027004 A1 * | 10/2001 | Park et al. | | 438/586 |
| 2001/0035706 A1 * | 11/2001 | Raina et al. | | 313/309 |
| 2002/0011645 A1 * | 1/2002 | Bertin et al. | | 257/529 |
| 2002/0100959 A1 * | 8/2002 | Joo et al. | | 257/532 |
| 2002/0155661 A1 * | 10/2002 | Massingill et al. | | 438/244 |
| 2002/0155694 A1 * | 10/2002 | Park | | 438/618 |
| 2002/0187630 A1 * | 12/2002 | Zedlitz et al. | | 438/629 |
| 2003/0113992 A1 * | 6/2003 | Yau et al. | | 438/623 |
| 2003/0143862 A1 * | 7/2003 | Iyer | | 438/758 |
| 2004/0183116 A1 * | 9/2004 | Cho et al. | | 257/303 |
| 2005/0127829 A1 * | 6/2005 | Takahashi | | 313/504 |
| 2005/0136683 A1 * | 6/2005 | Lee et al. | | 438/737 |
| 2005/0263767 A1 * | 12/2005 | Yamazaki et al. | | 257/72 |
| 2005/0266676 A1 * | 12/2005 | Hill | | 438/623 |
| 2006/0017168 A1 * | 1/2006 | Lee | | 257/758 |
| 2006/0068553 A1 * | 3/2006 | Thean et al. | | 438/285 |
| 2006/0125102 A1 * | 6/2006 | Wu et al. | | 257/759 |
| 2006/0264017 A1 * | 11/2006 | Miyagawa | | 438/587 |
| 2007/0012906 A1 * | 1/2007 | Kim et al. | | 257/3 |
| 2007/0049004 A1 * | 3/2007 | Smythe | | 438/619 |

FOREIGN PATENT DOCUMENTS

| KR | 2001-65232 | 7/2001 |
|---|---|---|

* cited by examiner

METAL INTERCONNECTION OF A SEMICONDUCTOR DEVICE AND METHOD OF FABRICATING THE SAME

BACKGROUND OF THE INVENTION

1. Field of the Invention

The present invention relates to a semiconductor device and a method of fabricating the same, and more particularly to a metal interconnection structure of a semiconductor device and a method of fabricating the same.

2. Description of the Related Art

Recently, with the increased degree of integration of semiconductor devices and rising demand for high performance thereof, metal interconnection of the semiconductor devices employs a multi-layer metal interconnection structure. In particular, the semiconductor memory devices, for example graphic dynamic random access memory (DRAM) devices requiring high speed operation exhibit a trend toward use of a tri layer metal interconnection structure instead of a double layer metal interconnection structure in metal interconnection. In order to reduce the RC signal delay caused by resistance components of metal interconnection layers and capacitor components of intermetallic dielectric layers in such multi-layer metal interconnection structures, the metal interconnection layers should be formed of metal materials having low specific resistance, and further, the intermetallic dielectric layers should be formed of materials having a low dielectric constant. In compliance with such requirements, recently, there is a trend toward formation of the intermetallic dielectric layers using low-k materials having a low dielectric constant.

Meanwhile, in order to reduce sheet resistance (Rs) of the metal interconnection layer itself, the thickness thereof should be increased. However, as the thickness of the metal interconnection layer increases, the thickness of the intermetallic dielectric layer should also be increased. On the other hand, in the case of low-k Spin On Glass (SOG)-based dielectric layers, which have recently been used as the intermetallic dielectric layer, the stress applied to the lower metal interconnection layer is increased when the thickness of the intermetallic dielectric layer is thicker than a certain thickness, and such stress is localized in specific regions, for example end parts of the metal interconnection layer, which correspond to edge parts of a wafer, upon heat treatment of the metal interconnection layer, causing cracks or lifting of the lower metal interconnection layers.

In order to solve such problems, silicon dioxide ($SiO_2$)-based materials having a low carbon content, as a buffer layer, have been conventionally disposed between the metal interconnection layer and intermetallic dielectric layer. As the silicon dioxide ($SiO_2$)-based materials, mention may be made of LP-tetra-ethyl-ortho-silicate (LP-TEOS) oxide layers, Middle Temperature Oxide (MTO) layers and Low Temperature Oxide (LTO) layers, which are deposited via use of Low Pressure Chemical Vapor Deposition (LPCVD), for example. Formation of such silicon dioxide ($SiO_2$)-based materials involves a high-temperature process of more than 600° C. Therefore, when aluminum (Al) or the like is employed as the lower metal interconnection layers, such a high-temperature process adversely affects the lower metal interconnection layers including aluminum (Al), thus making it difficult to enter practical application thereof. In contrast, where Plasma Enhanced Oxide (PEOX) involving a relatively low-temperature process is employed, plasma induced damage results in poor properties of transistors in cell regions and peripheral circuit regions, thus making it even more difficult to enter practical application thereof. Further, such a Plasma Enhanced Oxide exhibits relatively low stress-relieving properties and therefore cannot sufficiently serve as the buffer layer.

SUMMARY OF THE INVENTION

Therefore, the present invention has been made in view of the above problems, and it is an object of the present invention to provide a metal interconnection structure of a semiconductor device, which can be processed at a relatively low-temperature and is thus capable of reducing stress applied to lower metal interconnection layers without adverse effects thereon.

It is another object of the present invention to provide a method of fabricating such a metal interconnection structure of a semiconductor device.

In accordance with an aspect of the present invention, the above and other objects can be accomplished by the provision of a metal interconnection structure of a semiconductor device, comprising:

lower metal interconnection layers disposed on a semiconductor substrate;

a buffer layer disposed thereon and made of a metal oxide;

an intermetallic dielectric layer made of a low-k material disposed on the buffer layer of the metal oxide; and an upper metal interconnection layer disposed on the intermetallic dielectric layer and electrically connected through the intermetallic dielectric layer and buffer layer to the lower metal interconnection layers.

Preferably, the intermetallic dielectric layer has a thickness of 7,000 to 12,000 Å.

Preferably, the buffer layer has a thickness of 500 to 1,000 Å.

The buffer layer may be an aluminum oxide layer, a hafnium oxide layer or a zirconium oxide layer.

In accordance with another aspect of the present invention, there is provided a metal interconnection structure of a semiconductor device, comprising:

lower metal interconnection layers disposed on a semiconductor substrate;

a first buffer layer disposed thereon and made of a metal oxide;

a first intermetallic dielectric layer made of a low-k material disposed on the first buffer layer of the metal oxide;

a second buffer layer made of a metal oxide disposed on the first intermetallic dielectric layer;

a second intermetallic dielectric layer made of a low-k material disposed on the second buffer layer of a metal oxide; and an upper metal interconnection layer disposed on the second intermetallic dielectric layer and electrically connected through the second intermetallic dielectric layer, second buffer layer, first intermetallic dielectric layer and first buffer layer to the lower metal interconnection layers.

Preferably, the total thickness of the first and second intermetallic dielectric layers is within the range of 7,000 to 12,000 Å.

Herein, the first and second buffer layers may be aluminum oxide layers, hafnium oxide layers or zirconium oxide layers.

In accordance with yet another aspect of the present invention there is provided a method of fabricating a metal interconnection structure of a semiconductor device, comprising:

forming lower metal interconnection layers on a semiconductor substrate;

forming a buffer layer made of a metal oxide on the resulting structure;

forming an intermetallic dielectric layer made of a low-k material on the buffer layer of the metal oxide; and forming an upper metal interconnection layer on the intermetallic dielectric layer, such that the upper metal interconnection layer is disposed in electrical connection with the lower metal interconnection layers through the intermetallic dielectric layer and buffer layer.

Preferably, the intermetallic dielectric layer has a thickness of 7,000 to 12,000 Å.

Formation of the buffer layer may be carried out at a low temperature of less than 500° C. via use of a low pressure chemical vapor deposition (LPCVD).

The buffer layer may be formed of an aluminum oxide layer, a hafnium oxide layer or a zirconium oxide layer.

In accordance with a further aspect of the present invention, there is provided a method of fabricating a metal interconnection structure of a semiconductor device, comprising:

forming lower metal interconnection layers on a semiconductor substrate;

forming a first buffer layer made of a metal oxide on the resulting structure;

forming a first intermetallic dielectric layer made of a low-k material on the first buffer layer;

forming a second buffer layer made of a metal oxide on the first intermetallic dielectric layer;

forming a second intermetallic dielectric layer made of a low-k material on the second buffer layer; and forming an upper metal interconnection layer on the second intermetallic dielectric layer, such that the upper metal interconnection layer is disposed in electrical connection with the lower metal interconnection layers through the second intermetallic dielectric layer, second buffer layer, first intermetallic dielectric layer and first buffer layer.

Preferably, the total thickness of the first and second intermetallic dielectric layers is within the range of 7,000 to 12,000 Å.

Formation of the buffer layers may be carried out at a low temperature of less than 500° C. via use of low pressure chemical vapor deposition (LPCVD).

The buffer layers may be formed of aluminum oxide layers, hafnium oxide layers or zirconium oxide layers.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described more fully with reference to the accompanying drawings hereinafter, in which preferred embodiments of the invention are shown. This invention may, however, be embodied in different forms and should not be construed as limited to the embodiments set forth herein.

Figure 1:
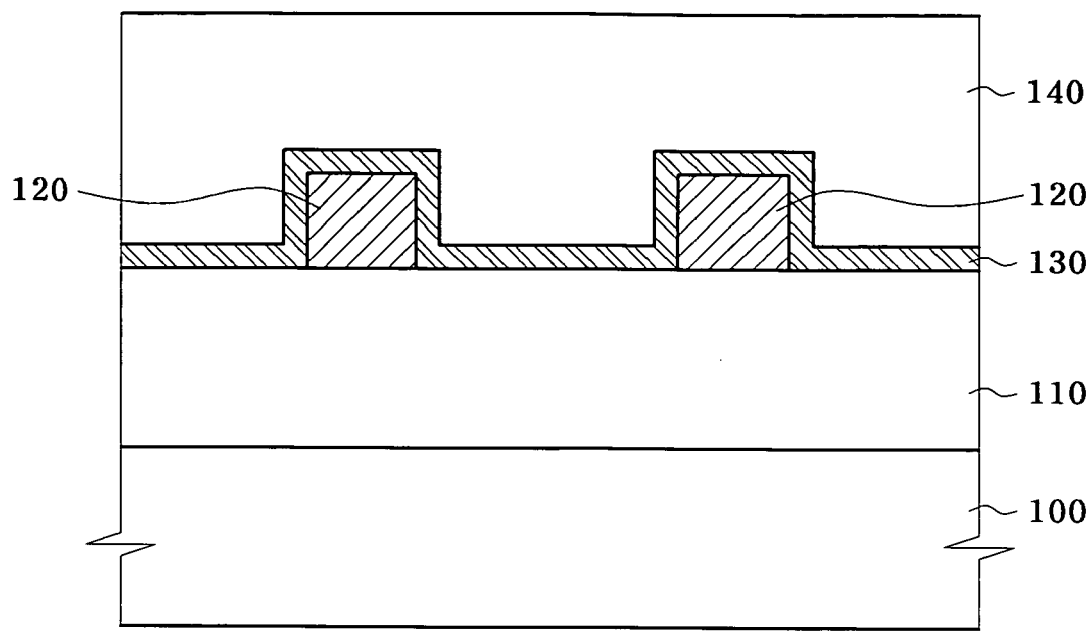
FIG. 1 is a cross-sectional view illustrating a metal interconnection structure of a semiconductor device in accordance with one embodiment of the present invention and a method of fabricating the same.

FIG. 1 is a cross-sectional view illustrating a metal interconnection structure of a semiconductor device in accordance with one embodiment of the present invention and a method of fabricating the same.

Referring now to FIG. 1, in a metal interconnection structure in accordance with this embodiment, lower metal interconnection layers 120 are disposed on an insulation layer 110 of a semiconductor substrate 100. Other devices such as transistors or capacitors may be formed between the semiconductor substrate 100 and lower metal interconnection layers 120. Herein, the lower metal interconnection layers 120 may be electrically connected with components of transistors or capacitors. A buffer layer 130 and an intermetallic dielectric layer 140 are sequentially disposed on the insulation layer 110 and lower metal interconnection layers 120. The buffer layer 130 serves to buffer stress applied to the lower metal interconnection layers 120 from the intermetallic dielectric layer 140. Therefore, where the intermetallic dielectric layer 140 has a thickness of 7,000 to 12,000 Å, that is relatively thin, the buffer layer 130 has a thickness of 500 to 1,000 Å.

The buffer layer 130 is formed of an insulation layer that can be deposited at a low temperature. For example, the buffer layer 130 may be formed of metal oxides such as aluminum oxide ($Al_2O_3$), hafnium oxide ($HfO_2$) and zirconium oxide ($ZrO_2$). As the metal oxide that can be deposited at a low temperature, mention may be made of tantalum oxide ($Ta_2O_5$). However, such tantalum oxide ($Ta_2O_5$) exhibits high stress when heat treatment at 700° C. is not carried out as a subsequent process, and thereby it is not suitable as the buffer layer 130. The intermetallic dielectric layer 140 is formed of a low-k material having a low dielectric constant. For example, the intermetallic dielectric layer 140 may be formed using a Spin On Glass (SOG) oxide layer, Spin On Dielectric (SOD) oxide layer, SiOC layer or SiOCH layer. Although not shown in FIG. 1, an upper metal interconnection layer (not shown), which is electrically connected through the intermetallic dielectric layer 140 and buffer layer 130 to the lower metal interconnection layers 120, is disposed on the intermetallic dielectric layer 140.

Hereinafter, a method of fabricating such a metal interconnection structure is described.

First, the lower metal interconnection layers 120 are formed on the insulation layer 110 of the semiconductor substrate 100. Next, the buffer layer 130 is formed on the insulation layer 110 and lower metal interconnection layers 120. The buffer layer 130 is formed via use of low pressure chemical vapor deposition (LPCVD). Where the buffer layer 130 is formed of aluminum oxide ($Al_2O_3$), formation of the buffer layer 130 is carried out using a precursor such as trimethylaluminum (TMA), triethylaluminum (TEA) or dimethylaluminum hydride (DMAH) as an aluminum source gas, and $O_3$, $O_2$ or $H_2O$ gas as a reactant gas, at a temperature of between 400 and 500° C. under pressure of 1 to 100 Torr. Where the buffer layer 130 is formed of hafnium oxide ($HfO_2$), formation of the buffer layer 130 is carried out using a precursor such as tetrakis(ethylmethylamino) hafnium (TEMAH), tetrakis(dimethylamino) hafnium (TDMAH) or tetrakis(diethylamino)hafnium (TDEAH) as a hafnium source gas, and $O_3$, $O_2$ or $H_2O$ gas as a reactant gas, at a temperature of about 350 to 500° C. under pressure of about 1 to 100 Torr. Where the buffer layer 130 is formed of zirconium oxide ($ZrO_2$), a precursor such as tetrakis(ethylmethylamino)zirconium (TEMAZ) is employed as the zirconium source gas. If necessary, tetrakis(dimethylamino)zirconium (TDMAZ) or tetrakis(diethylamino)zirconium (TDEAZ) may also be employed as the zirconium source gas. Similarly, a deposition process may also be carried out at a temperature of between 350 and 500° C. under pressure of 1 to 100 Torr.

Next, the intermetallic dielectric layer 140 is formed on the buffer layer 130, utilizing a low-k material. The low-k materials utilizable in this embodiment include Spin On Glass (SOG) oxide layer, Spin On Dielectric (SOD) oxide layer, SiOC layer and SiOCH layer. The intermetallic dielectric layer 140 is formed to a thickness of about 7,000 to 12,000 Å. Where the thickness of the intermetallic dielectric layer 140 is outside the above range, the buffer layer 130 suffers from limitations in its inhibiting effects of stress generated in the intermetallic dielectric layer 140. Therefore, where the intermetallic dielectric layer 140 has a thickness beyond the above range, a metal interconnection structure and a method of fabricating the same, which will be described hereinafter, in accordance with another embodiment of the present invention, are applied.

After formation of the intermetallic dielectric layer 140, the upper metal interconnection layer (not shown) is formed using conventional methods. As an example, a via-hole, which exposes a portion of the surface of the lower metal interconnection layers 220 through the intermetallic dielectric layer 140 and buffer layer 130, is formed. After forming a barrier metal layer, a metal layer is formed such that the via-hole is buried. Next, the metal layer is patterned to make a upper metal interconnection layer.

Figure 2:
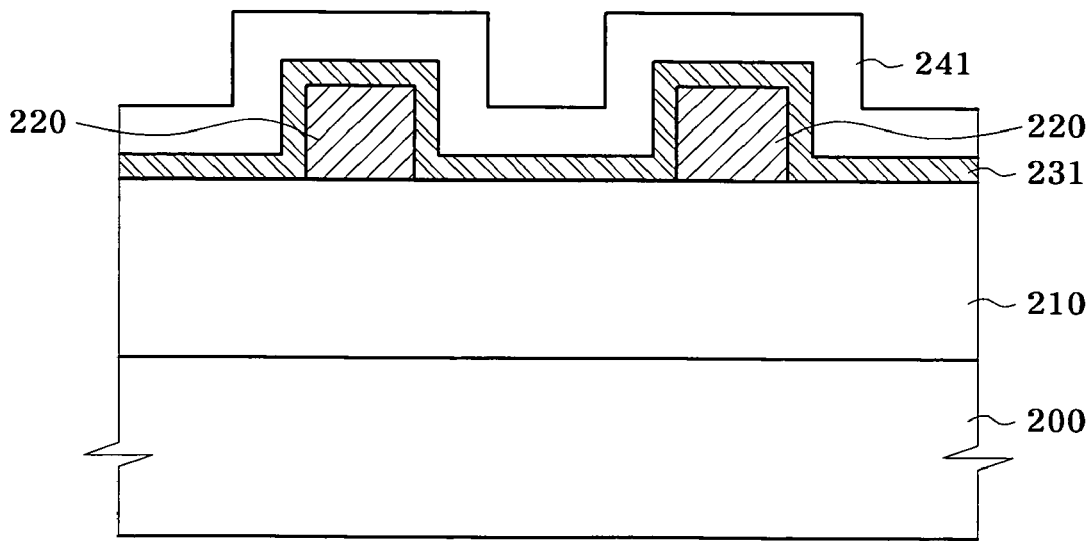
FIGS. 2 and 3 are cross-sectional views illustrating a metal interconnection structure of a semiconductor device in accordance with another embodiment of the present invention and a method of fabricating the same.
Figure 3:
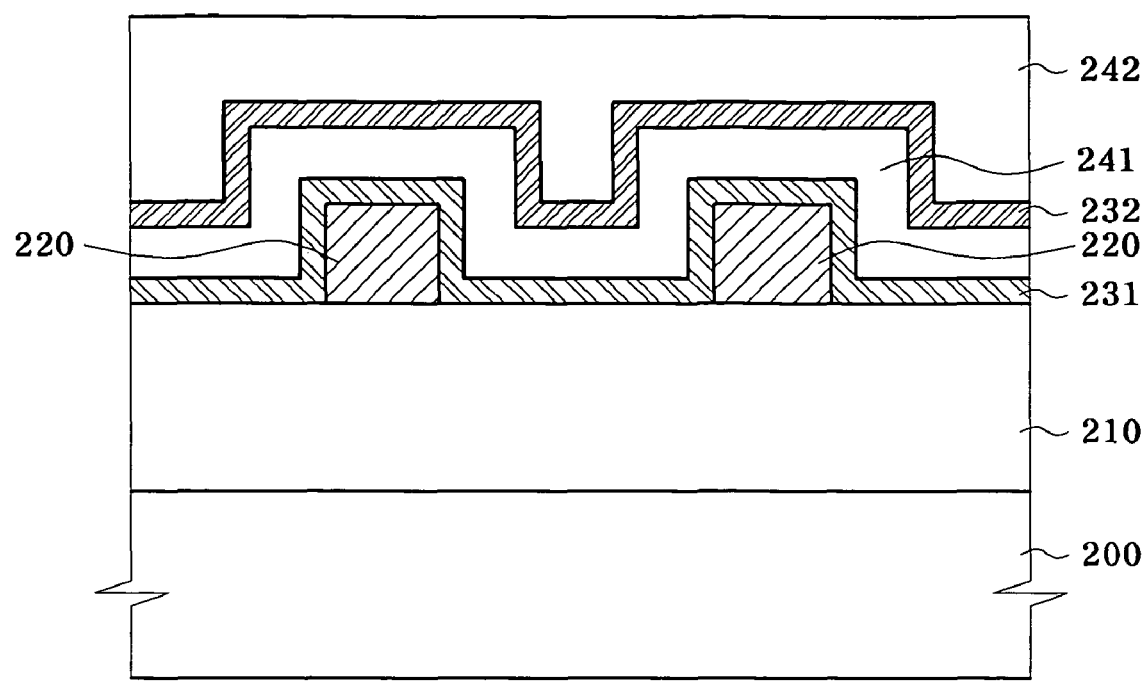

FIGS. 2 and 3 are cross-sectional views illustrating a metal interconnection structure of a semiconductor device in accordance with another embodiment of the present invention and a method of fabricating the same.

First, referring now to FIG. 3, in a metal interconnection structure in accordance with this embodiment, lower metal interconnection layers 220 are disposed on an insulation layer 210 of a semiconductor substrate 200. Other devices such as transistors or capacitors may be formed between the semiconductor substrate 200 and lower metal interconnection layers 220. A first buffer layer 231, a first intermetallic dielectric layer 241, a second buffer layer 232 and a second intermetallic dielectric layer 242 are sequentially disposed on insulation layer 210 and lower metal interconnection layers 220. The first and second buffer layers 231 and 232 serve to buffer stress applied to the lower metal interconnection layers 220 from the first and second intermetallic dielectric layers 241 and 242. Such a structure including the first and second buffer layers 231 and 232 disposed thereon, as in this embodiment, can be applied to the case in which a relatively large amount of stress is generated by intermetallic dielectric layers, due to thick thickness thereof. That is, such a double-buffer layer structure is applied when the thickness of the intermetallic dielectric layers, namely the total thickness of the first and second intermetallic dielectric layers 241 and 242 is outside the range of 7,000 to 12,000 Å.

The first and second buffer layers 231 and 232 are formed of insulation layers that can be deposited at a low temperature. For example, the first and second buffer layers 231 and 232 are made of metal oxides such as aluminum oxide ($Al_2O_3$), hafnium oxide ($HfO_2$) and zirconium oxide ($ZrO_2$). The first and second intermetallic dielectric layers 241 and 242 are made of low-k materials having a low dielectric constant. For example, the intermetallic dielectric layers are made of Spin On Glass (SOG) oxide layer, Spin On Dielectric (SOD) oxide layer, SiOC layer or SiOCH layer. Although not shown in FIG. 3, an upper metal interconnection layer (not shown), which is electrically connected through the second intermetallic dielectric layer 242, second buffer layer 232, first intermetallic dielectric layer 241 and first buffer layer 231 to the lower metal interconnection layers 220, is disposed on the second intermetallic dielectric layer 242.

In order to fabricate such a metal interconnection structure, the lower metal interconnection layers 220 are first formed on the insulation layer 210 of the semiconductor substrate 200. Next, the first buffer layer 231 is formed on the insulation layer 210 and lower metal interconnection layers 220. The first buffer layer 231 is formed via the use of low pressure chemical vapor deposition (LPCVD). Where the buffer layer 231 is formed of aluminum oxide ($Al_2O_3$), hafnium oxide ($HfO_2$), and zirconium oxide ($ZrO_2$), respectively, usable source gases, reactant gases and deposition conditions are the same as in the embodiment which was previously described with reference to FIG. 1 and thus details thereof will be omitted.

Next, the first intermetallic dielectric layer 241 is formed on the first buffer layer 231, utilizing a low-k material. The low-k materials usable in this embodiment include Spin On Glass (SOG) oxide layer, Spin On Dielectric (SOD) oxide layer, SiOC layer and SiOCH layer. Thereafter, the second buffer layer 232 is formed on the first intermetallic dielectric layer 241. The second buffer layer 232 is formed of the same material as the first buffer layer 231 and thus deposition conditions are also the same. Alternatively, the second buffer layer 232 may be formed of a different material than the first buffer layer 231, if necessary. After formation of the second buffer layer 232, the second intermetallic dielectric layer 242 is formed on the second buffer layer 232. Similarly, the second intermetallic dielectric layer 242 is formed of the same material as the first intermetallic dielectric layer 241, but may also be formed of a different material than the first intermetallic dielectric layer 241.

Thereafter, the upper metal interconnection layer (not shown) is formed using conventional methods. As an example, a via-hole, which exposes a portion of the surface of the lower metal interconnection layers 220 through the second intermetallic dielectric layer 242, second buffer layer 232, first intermetallic dielectric layer 241 and first buffer layer 231, is formed. After forming a barrier metal layer, a metal layer is formed such that the via-hole is buried. Next, the metal layer is patterned to make the upper metal interconnection layer.

As apparent from the above description, in accordance with a metal interconnection structure of a semiconductor device of the present invention and a method of fabricating the same, it is possible to reduce the stress applied to lower metal interconnection layers without adversely affecting the lower metal interconnection layers, via use of a metal oxide layer which can be deposited at a low temperature, as the buffer layer. Therefore, it is also possible to prevent occurrence of cracks or lifting on the metal interconnection layers, thereby increasing production yield.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A metal interconnection structure of a semiconductor device, comprising:
   lower metal interconnection layers disposed on a semiconductor substrate;
   an intermetallic dielectric layer made of a low-k material disposed on the semiconductor substrate, wherein the intermetallic dielectric layer has a thickness of 7,000 to 12,000 Å;

a first buffer layer for decreasing a stress applied to the lower metal interconnection layers from the intermetallic dielectric layer disposed between the lower metal interconnection layers and the intermetallic dielectric layer said first buffer layer made of a metal oxide, wherein the first buffer layer has a thickness of 500 to 1,000 Å, and wherein the first buffer layer is deposited by chemical vapor deposition at a temperature of less than 500° C.;

a first intermetallic dielectric layer made of a low-k material disposed on the first buffer layer of the metal oxide;

a second buffer layer deposited on the first intermetallic dielectric layer for decreasing a stress applied to the lower metal interconnection layers from the first intermetallic dielectric layer and from a second intermetallic dielectric layer, said second buffer layer made of a metal oxide, wherein the second buffer layer has a thickness of 500 to 1,000 Å, and wherein the second buffer layer is deposited at a temperature of less than 500° C.;

a second intermetallic dielectric layer made of a low-k material disposed on the second buffer layer of a metal oxide, wherein the total thickness of the first and second intermetallic dielectric layers is outside the range of 7,000 to 12,000 Å; and an upper metal interconnection layer disposed on the second intermetallic dielectric layer and electrically connected through the second intermetallic dielectric layer, second buffer layer, first intermetallic dielectric layer and first buffer layer to the lower metal interconnection layers.

2. The metal interconnection structure according to claim 1, wherein the first and second buffer layers are aluminum oxide layers, hafnium oxide layers or zirconium oxide layers.

3. A method of fabricating a metal interconnection structure of a semiconductor device, comprising:

forming lower metal interconnection layers on a semiconductor substrate;

forming a first buffer layer disposed on the lower interconnection layers, wherein said first buffer layer serves to buffer a stress applied to the lower metal interconnection layers from a first intermetallic dielectric layer, said buffer layer made of a metal oxide on the resulting structure, wherein the first buffer layer has a thickness of 500 to 1,000 Å, and wherein the first buffer layer is deposited by chemical vapor deposition at a temperature of less than 500° C.;

forming the first intermetallic dielectric layer made of a low-k material on the first buffer layer;

forming a second buffer layer disposed on the first intermetallic dielectric layer, wherein said second buffer layer serves to buffer a stress applied to the lower metal interconnection layers from the first intermetallic dielectric layer and from a second intermetallic dielectric layer, said second buffer layer made of a metal oxide, wherein the second buffer layer has a thickness of 500 to 1,000 Å, and wherein the second buffer layer is deposited at a temperature of less than 500° C.;

forming the second intermetallic dielectric layer made of a low-k material on the second buffer layer, wherein the total thickness of the first and second intermetallic dielectric layers is outside the range of 7,000 to 12,000 Å; and forming an upper metal interconnection layer on the second intermetallic dielectric layer, such that the upper metal interconnection layer is disposed in electrical connection with the lower metal interconnection layers through the second intermetallic dielectric layer, second buffer layer, first intermetallic dielectric layer and first buffer layer.

4. The method according to claim 3, wherein formation of the buffer layer is carried out via use of low pressure chemical vapor deposition (LPCVD).

5. The method according to claim 3, wherein the buffer layer is formed of an aluminum oxide layer, a hafnium oxide layer or a zirconium oxide layer.

* * * * *